(12) United States Patent
Yu

(10) Patent No.: US 6,908,282 B2
(45) Date of Patent: Jun. 21, 2005

(54) AIR FAN

(75) Inventor: Shou-Te Yu, Taipei Hsien (TW)

(73) Assignee: Asia Vital Components Co., Ltd., Kaohsiung (TW)

( * ) Notice: Subject to any disclaimer, the term of this patent is extended or adjusted under 35 U.S.C. 154(b) by 0 days.

(21) Appl. No.: 10/644,847

(22) Filed: Aug. 21, 2003

(65) Prior Publication Data

US 2005/0042086 A1 Feb. 24, 2005

(51) Int. Cl.$^7$ .............................................. F04D 29/00
(52) U.S. Cl. ............................... 415/211.2; 416/204 R; 416/244 R
(58) Field of Search .................. 415/211.2; 416/204 R, 416/234, 228, 244 R

(56) References Cited

U.S. PATENT DOCUMENTS 4,063,852 A * 12/1977 O'Connor .................... 416/228
5,188,508 A * 2/1993 Scott et al. .................. 415/206
6,244,818 B1 * 6/2001 Chang ....................... 415/208.2
6,579,064 B2 * 6/2003 Hsieh .......................... 416/182

* cited by examiner

*Primary Examiner*—Ninh H. Nguyen
(74) *Attorney, Agent, or Firm*—Bacon & Thomas PLLC

(57) ABSTRACT

An air fan mainly includes a frame and a blade portion. The blade portion is formed from a hub and a plurality of blades spaced around the hub; and the frame includes a plurality of locating members, and a driving section fixedly supported at inner ends of the locating members to locate at a center of the frame for the hub to rotatably connect thereto. The inner ends of the locating members are upward bent to axially extend into the frame by a predetermined height, and the hub is axially shortened by a length corresponding to the predetermined height of the bent inner ends of the locating members, so that a lower surface of the driving section is vertically spaced from a bottom surface of the frame, enabling airflows produced by the blade portion to move to a space below the lower surface of the driving section.

2 Claims, 4 Drawing Sheets

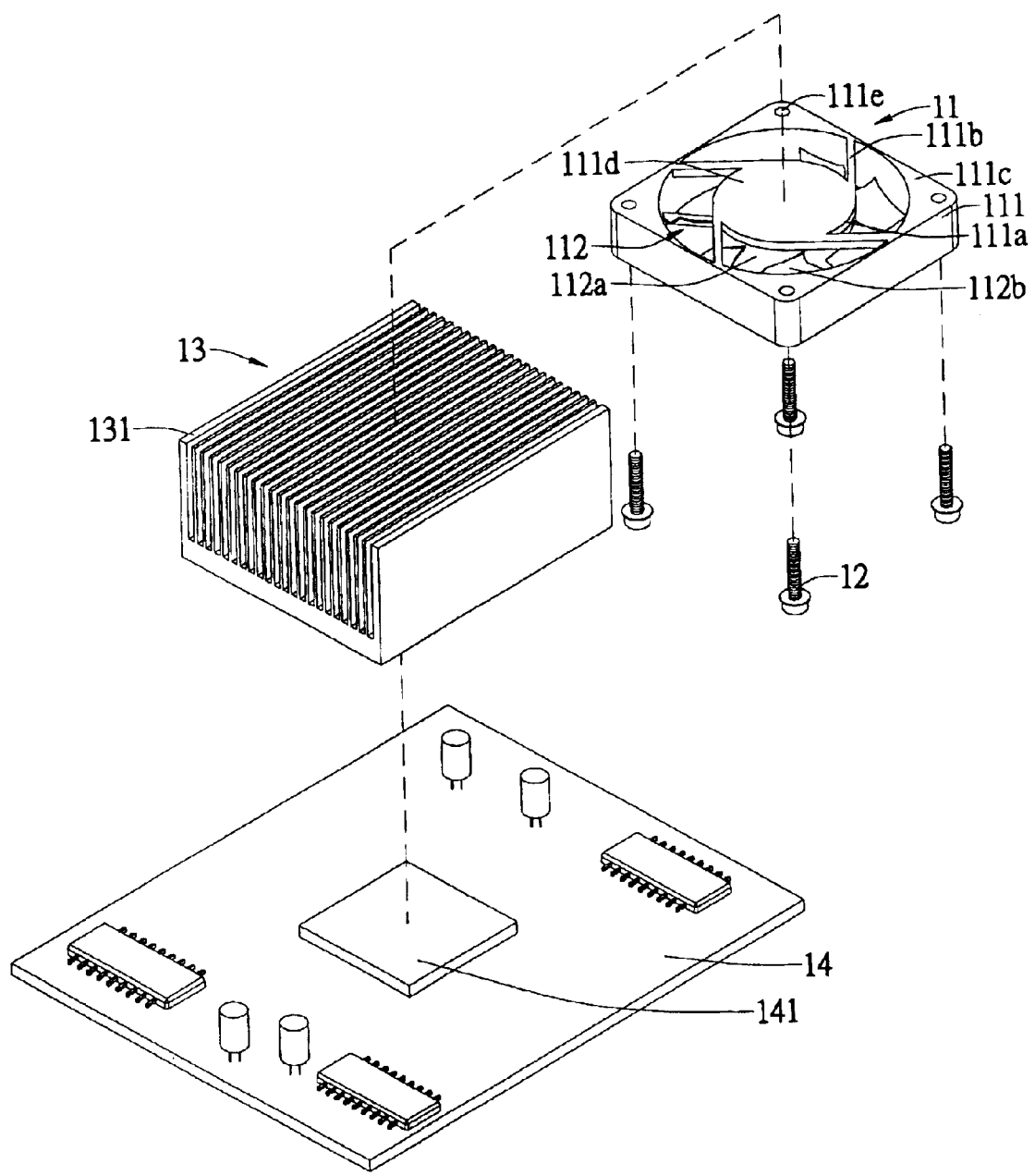
PRIOR ART FIG.1

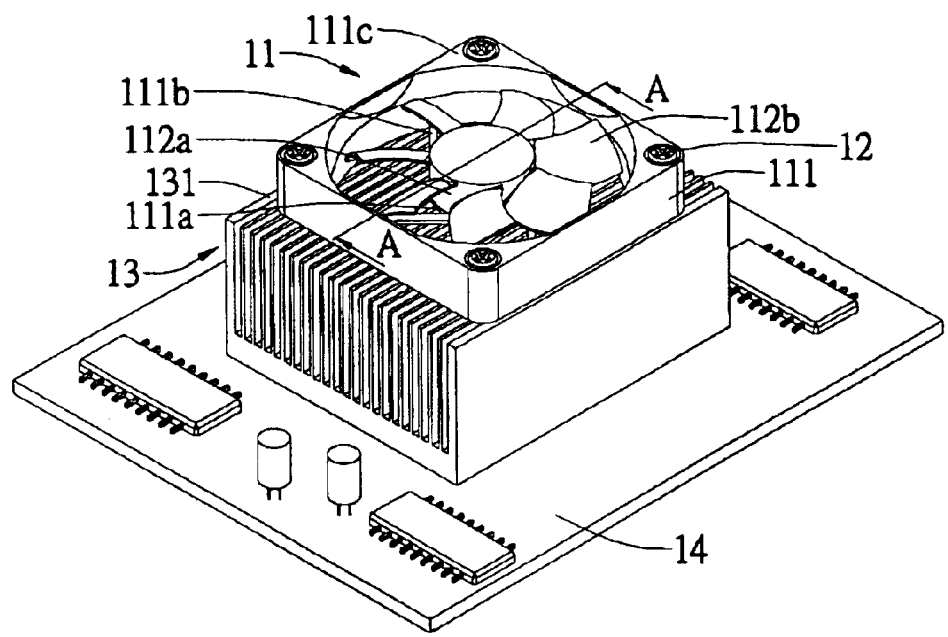
PRIOR ART FIG.2
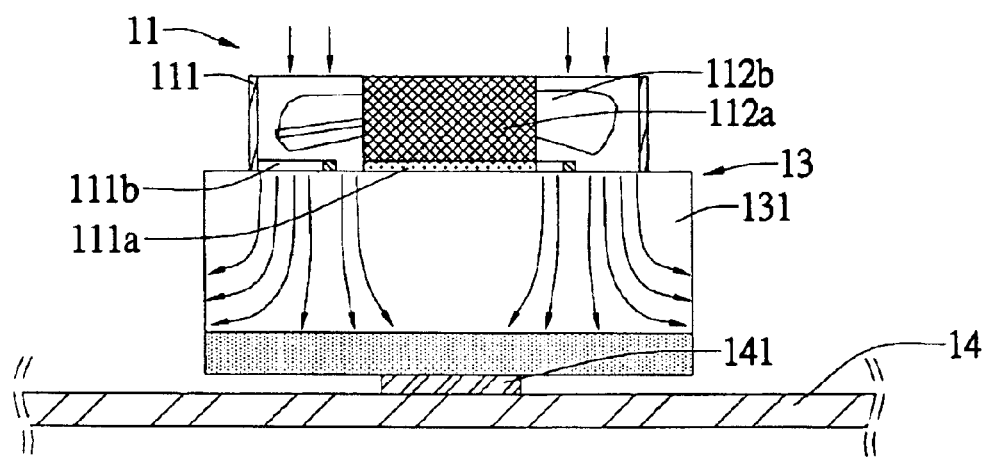
PRIOR ART FIG.3

AIR FAN

FIELD OF THE INVENTION

The present invention relates to an air fan, and more particularly to an air fan for assembling to a top of a plurality of radiation fins.

BACKGROUND OF THE INVENTION

FIG. 1 shows a conventional air fan 11 that mainly includes a frame 111 and a blade portion 112. The blade portion 112 includes a hub 112a and a plurality of blades 112b spaced around the hub 112a. The frame 111 includes a plurality of locating bars 111b, and a driving section 111a fixedly supported by the locating bars 111b to locate at a center of the frame 111 for the hub 112a to rotatably connect thereto. A lower surface 111d of the driving section 111a is flush with a bottom surface 111c of the frame 111.

Please refer to FIGS. 4 and 5 at the same time. The air fan 11 is connected to a top of a radiator 13 having a plurality of radiation fins 131. To assemble the air fan 11 to the radiator 13 for use, first extend fastening elements 12 through holes 111e provided on the frame 111 into the radiation fins 131. Thereafter, connect the radiator 13 at a bottom to a top of a chip 141 on a circuit board 14.

Please refer to FIG. 3. When the blade portion 112 is driven by the driving section 111a to rotate and produce airflows, there is a considerably large dead-air zone formed below the lower surface 111d of the driving section 111a to largely reduce the heat dissipating effect that may be achieved by the fan.

It is therefore tried by the inventor to develop an improved air fan to provide enhanced heat dissipating effect.

SUMMARY OF THE INVENTION

A primary object of the present invention is to provide an air fan providing enhanced heat dissipating effect. To achieve the above and other objects, the air fan of the present invention mainly includes a frame and a blade portion. The blade portion is formed from a hub and a plurality of blades spaced around the hub; and the frame includes a plurality of locating members, and a driving section fixedly supported at inner ends of the locating members to locate at a center of the frame for the hub to rotatably connect thereto. The inner ends of the locating members are upward bent to axially extend into the frame by a predetermined height, and the hub is axially shortened by a length corresponding to the predetermined height of the bent inner ends of the locating members, so that a lower surface of the driving section is vertically spaced from a bottom surface of the frame, causing airflows produced by the blade portion to move to a space below the lower surface of the driving section.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein FIG. 1 is an exploded perspective view of a conventional air fan;

FIG. 2 is an assembled perspective view of FIG. 1;

FIG. 3 is a sectional view taken along line A—A of FIG. 2 showing directions in which airflows produced by the air fan of FIG. 2 move;

DETAILED DESCRIPTION OF THE PREFERRED EMBODIMENTS

Figure 4:
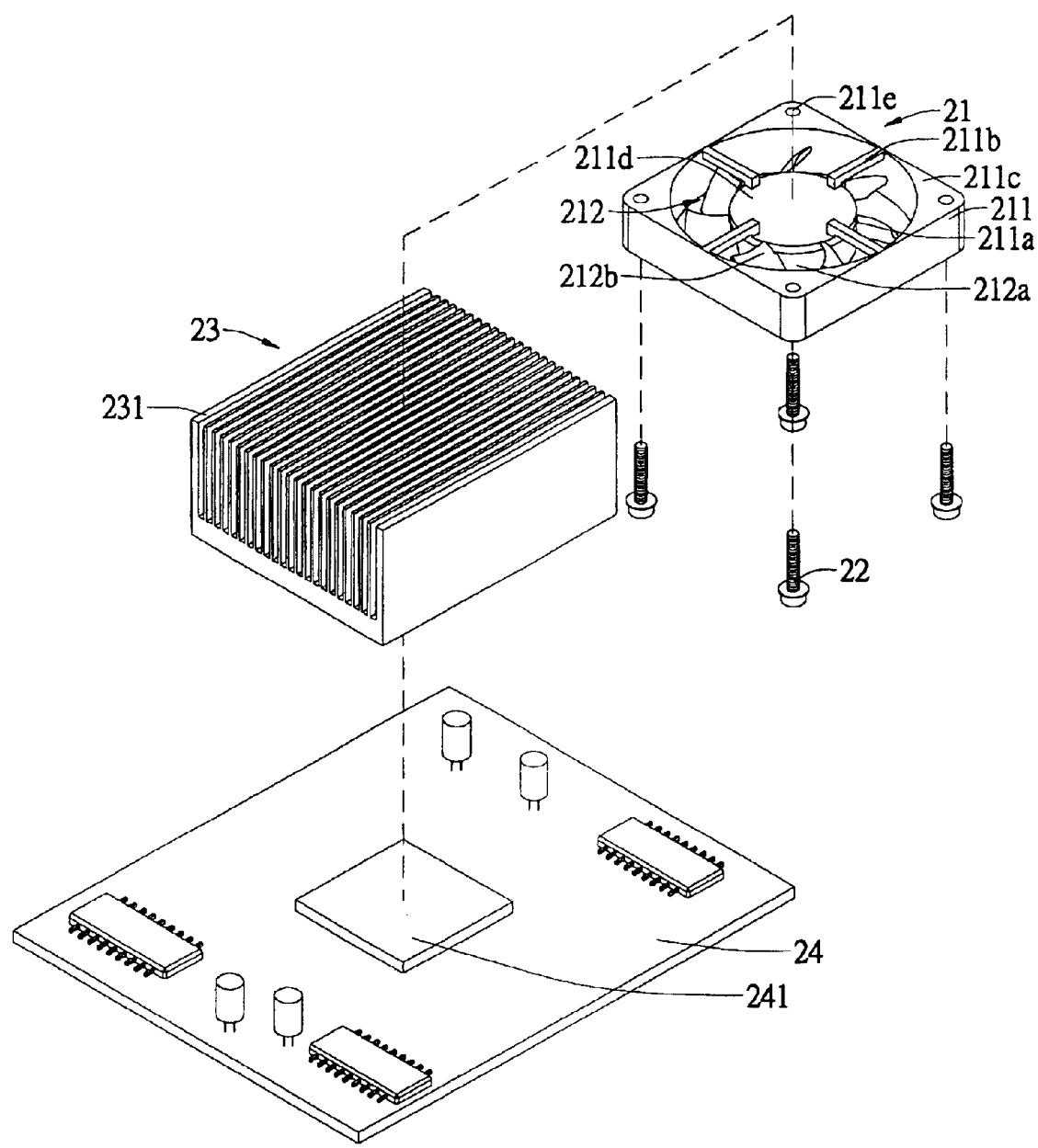
FIG. 4 is an exploded perspective view of an air fan according to a preferred embodiment of the present invention.

Please refer to FIG. 4 that is an exploded perspective view of an air fan 21 according to a preferred embodiment of the present invention. As show, the air fan 21 mainly includes a frame 211 and a blade portion 212. The blade portion 212 is formed from a hub 212a and a plurality of blades 212b spaced along an outer surface of the hub 212a. The frame 211 includes a plurality of locating members 211b, at inner ends of which a driving section 211a is fixedly supported to locate at a center of the frame 211 for the hub 212a of the blade portion 212 to rotatably connect thereto. The locating members 211b are so shaped that inner ends thereof are upward bent to axially extend into the frame 211 by a predetermined height, so that a lower surface 211d of the driving section 211a supported at the inner ends of the locating members 211b is vertically spaced from a bottom surface 211c of the frame 211 by that predetermined height. Moreover, to keep the fan portion 212 to flush with a top of the frame 211, the hub 212a rotatably connected to the driving section 211a is axially shortened by a length corresponding to the predetermined height of the bent inner ends of the locating members 211b, such that the blades 212b spaced around the hub 212a have an overall height larger than that of the hub 212a, as can be clearly seen from FIG. 6. That is, there is a difference between the overall heights of the hub 212a and the blades 212b, and the difference corresponds to the predetermined height of the bent inner ends of the locating members 211b.

Figure 5:
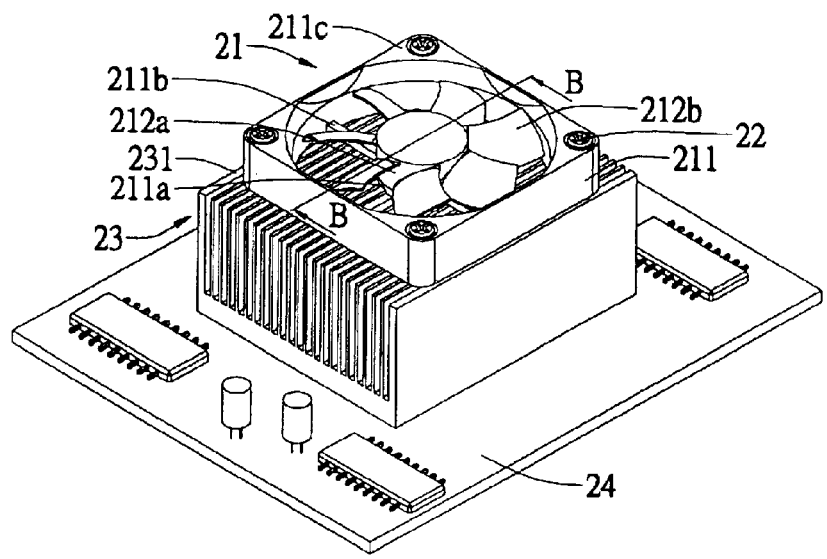
FIG. 5 is an assembled perspective view of FIG. 4.

Please refer to FIGS. 4 and 5 at the same time. The air fan 21 is connected to a top of a radiator 23 having a plurality of radiation fins 231. To assemble the air fan 21 to the radiator 23 for use, first extend fastening elements 22 through holes 211e provided on the frame 211 into the radiation fins 231. Thereafter, connect the radiator 23 at a bottom to a top of a chip 241 on a circuit board 24.

Figure 6:
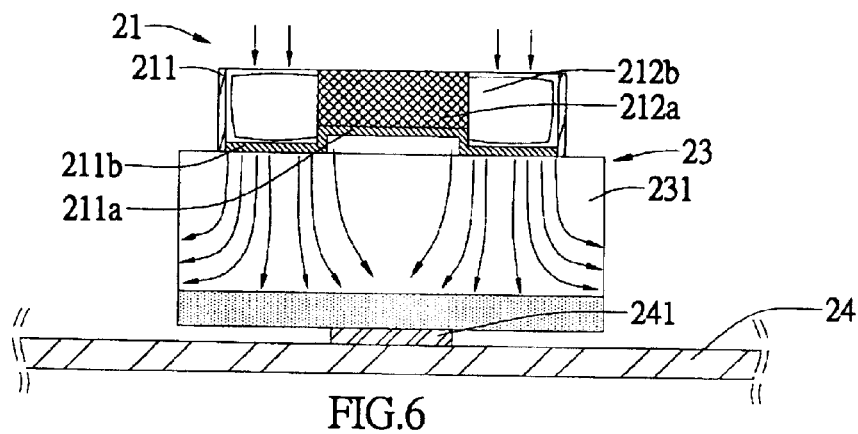
FIG. 6 is a sectional view taken along line B—B of FIG. 5 showing directions in which airflows produced by the air fan of FIG. 5 move.

Please refer to FIG. 6. When the blade portion 212 of the air fan 21 is driven by the driving section 211a to rotate, airflows produced by the blade portion 212 also move toward a space below the lower surface 211d of the driving section 211a to contact with an enlarged area on the radiator 23 and thereby provide an enhanced heat dissipating effect.

Figure 7:
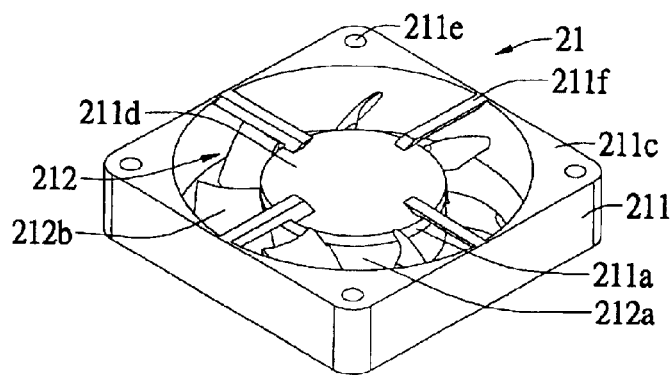
FIG. 7 is a perspective view of another embodiment of the present invention, the locating members of which have inclined outer surfaces to also serve as airflow-guiding members.

FIG. 7 shows another embodiment of the air fan of the present invention. This embodiment is generally structurally similar to the preferred embodiment, except that the locating members 211b are provided with inclined outer surfaces to also serve as airflow-guiding members 211f, so that airflows produced by the blade portion 212 rotated by the driving section 211a are more quickly guided by the airflow-guiding members 211f to the space below the lower surface 211d of the driving section 211a.

The present invention has been described with some preferred embodiments thereof and it is understood that many changes and modifications in the described embodiments can be carried out without departing from the scope and the spirit of the invention that is intended to be limited only by the appended claims.

What is claimed is:

1. An air fan comprising a frame and a blade portion; said blade portion including a hub and a plurality of blades spaced around said hub; and said frame including a plurality of locating members, and a driving section fixedly supported at inner ends of said locating members to locate at a center of said frame for said hub of said blade portion to rotatably connect thereto; said air fan being characterized in that said locating members have inner ends that are upward bent to axially extend into said frame by a predetermined height, and that said hub rotatably connected to said driving section is axially shortened by a length corresponding to said predetermined height, enabling airflows produced by said blade portion rotated by said driving section to move to a space below said lower surface of said driving section.

2. The air fan as claimed in claim 1, wherein said locating members have inclined outer surfaces to also serve as airflow-guiding members to guide the airflows produced by said blade portion rotated by said driving section to more quickly move to the space below said lower surface of said driving section.

* * * * *